(12) United States Patent
Eguchi

(10) Patent No.: US 8,508,217 B2
(45) Date of Patent: Aug. 13, 2013

(54) OUTPUT CIRCUIT OF CHARGE MODE SENSOR

(75) Inventor: Yoshimasa Eguchi, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 413 days.

(21) Appl. No.: 12/960,556

(22) Filed: Dec. 6, 2010

(65) Prior Publication Data

US 2011/0204877 A1 Aug. 25, 2011

(30) Foreign Application Priority Data

Feb. 19, 2010 (JP) .................................. 2010-034492

(51) Int. Cl.
*G01R 1/30* (2006.01)

(52) U.S. Cl.
USPC ................... 324/123 R; 324/123 C; 324/727; 324/615; 324/619; 324/102; 330/69; 330/174; 330/9; 330/85; 330/107; 327/106; 327/107; 327/307

(58) Field of Classification Search
USPC ......................................... 324/123 R, 514.34
See application file for complete search history.

(56) References Cited

U.S. PATENT DOCUMENTS

| | | | | |
|---|---|---|---|---|
| 4,473,796 A | * | 9/1984 | Nankivil | 324/649 |
| 4,888,514 A | * | 12/1989 | Takahashi et al. | 310/316.02 |
| 5,062,294 A | * | 11/1991 | Iwata | 73/114.21 |
| 6,246,287 B1 | * | 6/2001 | Yamashita | 330/174 |
| 6,326,795 B1 | * | 12/2001 | Matsumoto et al. | 324/679 |
| 6,335,642 B1 | * | 1/2002 | Hiroshima et al. | 327/102 |
| 7,997,144 B1 | * | 8/2011 | Pekarek et al. | 73/777 |
| 2002/0125943 A1 | * | 9/2002 | Yamashita | 330/69 |
| 2004/0075498 A1 | * | 4/2004 | Matsui et al. | 330/174 |
| 2004/0090277 A1 | * | 5/2004 | Tsyrganovich | 331/74 |
| 2007/0296496 A1 | * | 12/2007 | Blumen et al. | 330/174 |

FOREIGN PATENT DOCUMENTS

| | | |
|---|---|---|
| JP | 58-26631 U | 8/1981 |
| JP | 04-299607 | 10/1992 |
| JP | 2007-051930 | 3/2007 |

OTHER PUBLICATIONS

Japanese Office Action for corresponding JP Application No. 2010-034492, Jan. 31, 2012.

\* cited by examiner

*Primary Examiner* — Arleen M Vazquez
*Assistant Examiner* — Thang Le
(74) *Attorney, Agent, or Firm* — Ditthavong Mori & Steiner, P.C.

(57) ABSTRACT

An output circuit of a charge mode sensor includes a second resistor and an operational amplifier. The second resistor connects an output portion of the charge mode sensor and a ground. The operational amplifier is configured to output a detection signal that varies in accordance with an amount of charge kept in the charge mode sensor. The operational amplifier includes an inverting input portion, a non-inverting input portion, and an output portion. The inverting input portion is connected to the output portion of the charge mode sensor via a sensor cable. The non-inverting input portion is connected to a reference voltage. The output portion is connected to the inverting input portion via a first resistor.

14 Claims, 3 Drawing Sheets

BACKGROUND ART

OUTPUT CIRCUIT OF CHARGE MODE SENSOR

CROSS-REFERENCE TO RELATED APPLICATIONS

The present application claims priority under 35 U.S.C. §119 to Japanese Patent Application No. 2010-034492, filed Feb. 19, 2010, entitled "Output circuit of charge mode sensor." The contents of this application are incorporated herein by reference in their entirety.

BACKGROUND OF THE INVENTION

1. Field of the Invention

The present invention relates to an output circuit of a charge mode sensor.

2. Description of the Related Art

Output circuits for charge mode sensors such as piezoelectric elements in related art include charge-voltage conversion circuits (charge amplifier circuits) that accumulate the charge of the sensors in capacitors to acquire output voltages from the capacitors and current-voltage conversion circuits that measure the amount of current passing through resistors as the amount of charge of the sensors to acquire output voltages from the current.

Japanese Unexamined Patent Application Publication No. 2007-51930 discloses a signal processing apparatus for a charge mode sensor. In the signal processing apparatus, abnormality of the charge mode sensor is detected in a charge-voltage conversion circuit (charge amplifier circuit).

Since the insulation resistance of a sensor cable and the input impedance of an operational amplifier are practically finite in the charge-voltage conversion circuit (charge amplifier circuit) in the related art, part of the charge generated in the charge mode sensor leaks through the insulation resistor of the sensor cable or the input terminal of the operational amplifier. As a result, measurement error (reduction in sensitivity and/or zero-point drift), particularly, the measurement error at low frequencies or in long-time measurement is increased.

It is not possible to avoid or reduce the problem of the measurement error with the signal processing apparatus using the charge-voltage conversion circuit (charge amplifier circuit) disclosed in Japanese Unexamined Patent Application Publication No. 2007-51930. In contrast, it is possible to reduce the measurement error (reduction in sensitivity) due to the insulation resistance and the input impedance with the current-voltage conversion circuit in the related art.

However, with the current-voltage conversion circuit in the related art, it is not possible to detect any fault (break or short circuit) occurring in the charge mode sensor or the sensor cable circuit if no charge is made. Accordingly, in order to confirm any fault before the measurement of the charge, it is necessary to additionally prepare a fault detection circuit that has no effect on the circuit.

In addition, use of the measured temperature of the charge mode sensor in temperature compensation of measurement data is not considered in the conversion circuits in both modes in the related art.

SUMMARY OF THE INVENTION

According to one aspect of the present invention, an output circuit of a charge mode sensor includes a second resistor and an operational amplifier. The second resistor connects an output portion of the charge mode sensor and a ground. The operational amplifier is configured to output a detection signal that varies in accordance with an amount of charge kept in the charge mode sensor. The operational amplifier includes an inverting input portion, a non-inverting input portion, and an output portion. The inverting input portion is connected to the output portion of the charge mode sensor via a sensor cable. The non-inverting input portion is connected to a reference voltage. The output portion is connected to the inverting input portion via a first resistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
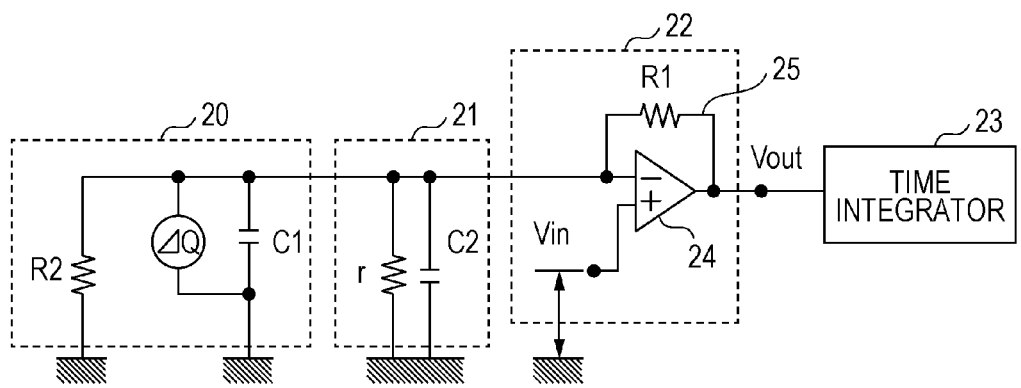
FIG. 1 illustrates an example of the configuration of an output circuit of a charge mode sensor according to an embodiment of the present invention.

The embodiments of the present invention will herein be described with reference to the attached drawings, wherein like reference numerals designate corresponding or identical elements throughout the various drawings. The description is given while referring to a drawing demonstrating the related art, if needed, for comparison. Although a piezoelectric sensor using a sensor cable is used as a charge mode sensor in the following description, the present invention is not limited to the use of the piezoelectric sensor. The present invention is applicable to any charge mode sensor including an electrostatic capacitance sensor using a variation in electrostatic capacitance between electrode substrates and a triboelectric sensor using the amount of static electricity caused by frictional force.

Figure 2:
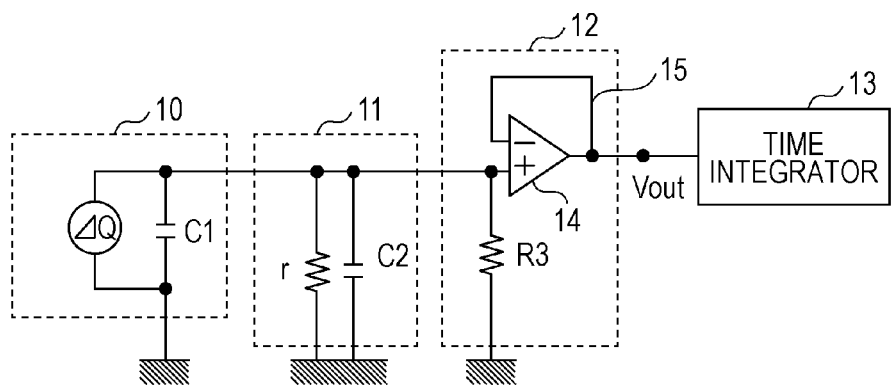
FIG. 2 illustrates an example of the configuration of a current-voltage conversion circuit of a charge mode sensor in the related art.

FIG. 1 illustrates an example of the configuration of an output circuit of a charge mode sensor according to an embodiment of the present invention. FIG. 2 illustrates an example of the configuration of a current-voltage conversion circuit of a charge mode sensor in the related art, which is shown for comparison. The current-voltage conversion circuit of the charge mode sensor in the related art in FIG. 2 will be described first.

Referring to FIG. 2, an equivalent circuit of a piezoelectric sensor is shown in an area 10. The area 10 includes an electrostatic capacitor C1 in the piezoelectric sensor. ΔQ denotes the amount of charge generated in the piezoelectric sensor. An equivalent circuit of a sensor cable of the piezoelectric sensor is shown in an area 11. The area 11 includes an insulation resistor r and an electrostatic capacitor C2. A current-voltage conversion circuit is shown in an area 12. The area 12 includes an operational amplifier 14. A non-inverting input (+) of the operational amplifier is connected to the sensor cable of the piezoelectric sensor and is grounded via a resistor R3. An inverting input (−) of the operational amplifier is connected to an output Vout thereof via a feedback line 15. The output Vout of the operational amplifier 14 is supplied to a time integrator 13. The time integrator 13 is a circuit used to perform time integration to the output Vout in order to acquire measurement data in proportion to the charge ΔQ.

The circuit in FIG. 2 outputs the output Vout, which is generated when a current $I_R$ (=d(ΔQ)/dt) caused by the charge ΔQ generated in the piezoelectric sensor flows through the resistor R3. When a phenomenon to be measured has a frequency sufficiently lower than a cutoff frequency fc=1/(2π(C1+C2)R3) and the insulation resistance r of the sensor cable and the input impedance of the operational amplifier are infinite, the output Vout in proportion to the current $I_R$ caused by the charge ΔQ is calculated according to Equation (1), irrespective of the electrostatic capacitance C1 of the piezoelectric sensor and the electrostatic capacitance C2 of the sensor cable. In addition, measurement data resulting from the time integration of the output Vout is acquired from the time integrator 13.

$$Vout = I_R \times R3 \tag{1}$$

In the current-voltage conversion circuit in the related art in FIG. 2, the output characteristics are varied around the cutoff frequency fc. Specifically, the output Vout in proportion to the current $I_R$ according to Equation (1) is generated when the phenomenon to be measured has a frequency lower than the cutoff frequency fc while the output Vout in proportion to the charge ΔQ is generated when the phenomenon to be measured has a frequency higher than the cutoff frequency fc.

In addition, in the current-voltage conversion circuit in the related art in FIG. 2, the output Vout is kept at zero when the charge ΔQ is not generated even if a fault (break or short circuit) occurs in the piezoelectric sensor or the sensor cable and, thus, it is not possible to detect the fault. The break means a state in which the input into the current-voltage conversion circuit is open and the short circuit means a state in which the input into the current-voltage conversion circuit is grounded. Accordingly, the fault is detected only after the measurement is practically started and it is confirmed that the charge ΔQ cannot be measured in the circuit in FIG. 2. Consequently, it is necessary to additionally prepare a fault detection circuit that has no effect on the circuit in order to confirm any fault before the measurement of the charge ΔQ to ensure the reliability of the operation of the circuit.

Referring to FIG. 1, an equivalent circuit of a piezoelectric sensor is shown in an area 20. The area 20 includes an electrostatic capacitor C1 in the piezoelectric sensor and a resistor R2, which is newly added. ΔQ denotes the amount of charge generated in the piezoelectric sensor. Although the resistor R2 is shown as part of the piezoelectric sensor in FIG. 1, the resistor R2 may be an external resistor connected to the output of the piezoelectric sensor.

An equivalent circuit of a sensor cable of the piezoelectric sensor is shown in an area 21. The area 21 includes an insulation resistor r and an electrostatic capacitor C2. A current-voltage conversion circuit is shown in an area 22. The area 22 includes an operational amplifier 24, a reference voltage Vin input into a non-inverting input (+) of the operational amplifier 24, and a resistor R1 provided on a feedback line 25 connecting an inverting input (−) of the operational amplifier 24 and an output Vout thereof. The inverting input (−) of the operational amplifier 24 is connected to the sensor cable of the piezoelectric sensor and the output Vout thereof is supplied to a time integrator 23.

The circuit of the embodiment of the present invention in FIG. 1 outputs the output Vout resulting from offset of the charge ΔQ generated in the piezoelectric sensor by the current flowing through the resistor R1 by the operational amplifier 24. Since the current flowing through the resistor R2 in the piezoelectric sensor is fixed with its resistance and the reference voltage Vin, the charge ΔQ generated in the piezoelectric sensor does not flow through the resistor R2 in the piezoelectric sensor and is completely offset by the current fed back through the resistor R1. The output Vout in proportion to a current $I_d$ (=d (ΔQ)/dt) is calculated according to Equation (2), irrespective of the electrostatic capacitance C1 of the piezoelectric sensor and the electrostatic capacitance C2 of the sensor cable.

$$Vout = (I_d + Vin/R2) \times R1 + Vin \tag{2}$$

Figure 3:
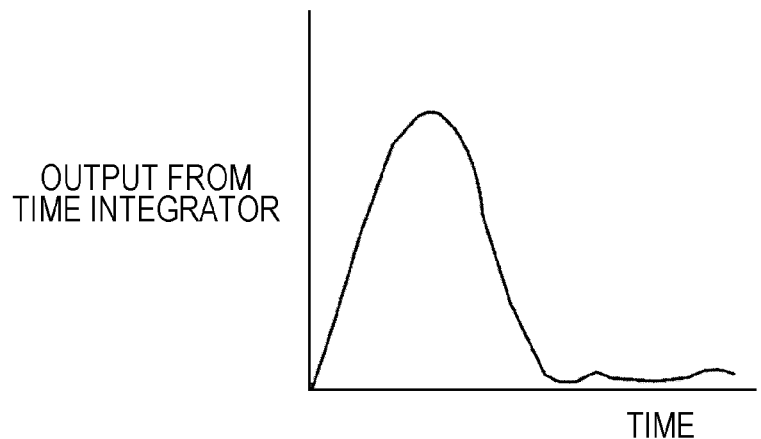
FIG. 3 is a graph illustrating an exemplary output from a time integrator in FIG. 2.

Measurement data resulting from the time integration of the output Vout is output from the time integrator 23. FIG. 3 is a graph illustrating an exemplary output from the time integrator 23. The amount of time integration is proportional to the amount of charge ΔQ generated in the piezoelectric sensor.

The circuit in FIG. 1 has the advantage in that it is possible to set the resistor R2 of the piezoelectric sensor to a value that is sufficiently smaller than the insulation resistance r of the sensor cable and the input impedance of the operational amplifier 24. As a result, the effect on the output Vout of the variation in the insulation resistance r of the sensor cable and the variation in a minute current flowing into the inverting input (−) of the operational amplifier 24 can be sufficiently reduced to a negligible level.

In addition, in the circuit in FIG. 1, it is possible to detect the break or short circuit of the piezoelectric sensor or the sensor cable by shifting the zero point (base voltage) of the output Vout when the charge ΔQ is not generated from the ground voltage to make the output Vout to be equal to the reference voltage Vin or to cause the output Vout to be saturated. The break means a state in which the input into the current-voltage conversion circuit is open and the short circuit means a state in which the input into the current-voltage conversion circuit is grounded. Accordingly, it is possible to detect any fault (break or short circuit) from the output Vout even before the measurement of the charge ΔQ by constantly monitoring the output Vout in order to ensure the reliability of the operation of the circuit. The detection of the fault will be further described below.

Furthermore, the resistance R2 in the piezoelectric sensor, which is known to have large temperature characteristics, can be replaced with a resistance thermometer to detect the variation in the amount of offset (offset voltage) at the zero point of the output Vout, thereby measuring the internal temperature of the piezoelectric sensor. The measured temperature can be used in the temperature compensation of the measurement data.

Figure 4:
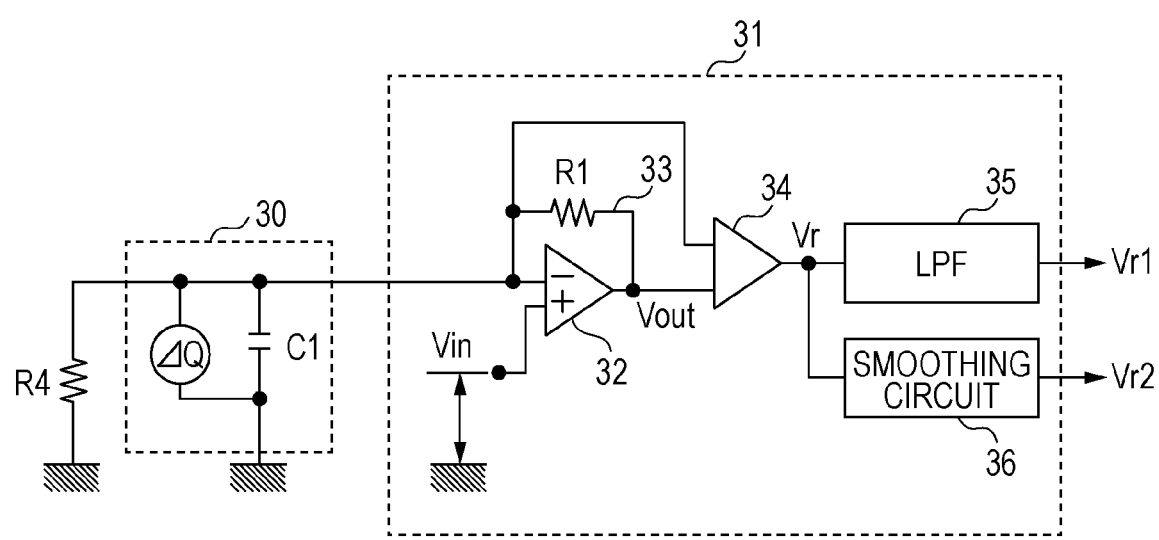
FIG. 4 illustrates an example of the configuration of an output circuit of a charge mode sensor according to another embodiment of the present invention.

FIG. 4 illustrates an example of the configuration of an output circuit of a charge mode sensor according to another embodiment of the present invention. With the configuration in FIG. 4, it is possible to detect the fault (break or short circuit) described above and to measure the internal temperature of the piezoelectric sensor.

Referring to FIG. 4, an equivalent circuit of a piezoelectric sensor is shown in an area 30. C1 denotes the electrostatic capacitor in the piezoelectric sensor and ΔQ denotes the amount of charge generated in the piezoelectric sensor. A resistance R4 is a resistance thermometer, such as a thermistor or a platinum (Pt) resistor. The resistance R4 is arranged at least near the piezoelectric sensor.

A current-voltage conversion circuit is shown in an area 31. As in the configuration in FIG. 1, the area 31 includes an operational amplifier 32, a reference voltage Vin input into a non-inverting input (+) of the operational amplifier 32, and a resistor R1 provided on a feedback line 33 connecting an inverting input (−) of the operational amplifier 32 and an output Vout thereof. The inverting input (−) of the operational amplifier 32 is connected to the sensor cable of the piezoelectric sensor and is supplied to a differential amplifier 34 along with the output Vout. The differential amplifier 34 is provided to make an output resulting from removal of the effect of the reference voltage Vin. An output Vr from the differential amplifier 34 is supplied to a low pass filter 35 and a smoothing circuit 36. The low pass filter 35 performs removal of high-frequency noise, offset correction, and amplification to the output Vr to output an output Vr1. The smoothing circuit 36 performs smoothing (conversion into direct-current (DC) voltage) and amplification to the output Vr to output a DC voltage Vr2 resulting from removal of a detection signal component detected by the piezoelectric sensor.

Figure 5:
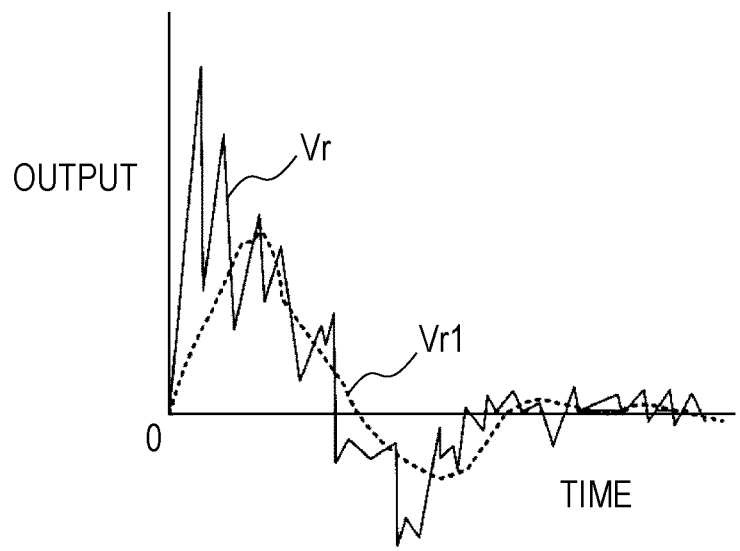
FIG. 5 is a graph illustrating an exemplary output from the output circuit of the charge mode sensor in FIG. 4.
Figure 6:
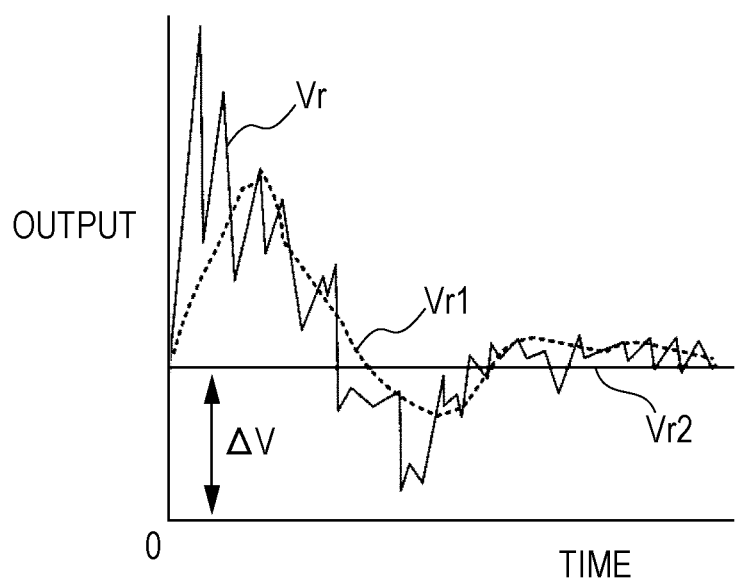
FIG. 6 is a graph illustrating another exemplary output from the output circuit of the charge mode sensor in FIG. 4.

FIGS. 5 and 6 are graphs illustrating exemplary outputs from the circuit in FIG. 4. The output Vr from the differential amplifier 34 and the output Vr1 from the low pass filter 35 are shown in FIG. 5. The outputs Vr and Vr1 in FIG. 5 reflect a detection signal detected by the piezoelectric sensor in a state in which the temperature detection by the resistance thermometer R4 is not performed and a fault (break or short circuit) of the piezoelectric sensor or the sensor cable does not occur. The outputs Vr and Vr1 are varied on an initial offset level (0 V in FIG. 5). The output Vr1 has a waveform resulting from removal of a high-frequency noise component of the output Vr.

The output Vr from the differential amplifier 34, the output Vr1 from the low pass filter 35, and the DC output Vr2 from the smoothing circuit 36 are shown in FIG. 6. In FIG. 6, the temperature detection by the resistance thermometer R4 is performed and the offset levels of the outputs Vr and Vr1 are increased by Δ V, thereby producing the DC output Vr2 from the smoothing circuit 36 corresponding to the Δ V. If any fault (break) of a piezoelectric cable occurs, the DC output Vr2 from the smoothing circuit 36 is kept at 0 V. In contrast, if any fault (short circuit) of the piezoelectric sensor or the sensor cable occurs, the DC output Vr2 from the smoothing circuit 36 is kept at a value that is saturated at the upper limit of the range.

As apparent from the exemplary output in FIG. 6, in the circuit in FIG. 4, a current (detection signal) generated from the piezoelectric sensor, a temperature signal (the variation in temperature due to the resistance thermometer R4), or a fault (break or short circuit) signal from the piezoelectric sensor or the sensor cable can be acquired from the voltage waveform of the output signal Vr, Vr1, or Vr2. In addition, the time integration of the detection signal Vr1 corresponding to the current generated from the piezoelectric sensor with, for example, a time integrator allows a signal in proportion to the charge ΔQ generated in the piezoelectric sensor to be generated.

The above embodiments are only examples and the present invention is not limited to the above embodiments. As described above, the present invention is applicable not only to the piezoelectric sensor but also to any charge mode sensor, such as an electrostatic capacitance acceleration sensor or an electrostatic capacitance load sensor, without an oscillator circuit and a detector circuit. The present invention is also applicable to any current mode sensor, such as a piezoresistance acceleration sensor or a piezoresistance load sensor.

According to the embodiment of the present invention, it is possible to reduce the measurement error (reduction in sensitivity) due to the insulation resistance and the input impedance in the output circuit of the charge mode sensor.

The operational amplifier preferably outputs a certain offset signal if a break or short circuit occurs in the charge mode sensor or the sensor cable.

According to the embodiment of the present invention, it is possible to detect a fault (break or short circuit) of the charge mode sensor or the sensor cable circuit even before the measurement is practically started.

The reference voltage is preferably a certain voltage higher than zero volt. The offset signal from the operational amplifier may be the certain voltage or a saturated output voltage from the operational amplifier depending on the break or short circuit of the charge mode sensor or the sensor cable.

According to the embodiment of the present invention, it is possible to selectively detect either the break or the short circuit of the charge mode sensor or the sensor cable from the output from the output circuit of the charge mode sensor (the offset signal from the operational amplifier).

The output circuit of the charge mode sensor preferably further includes a determination circuit that is connected to the output of the operational amplifier and that determines any break or short circuit of the charge mode sensor or the sensor cable. The determination circuit preferably includes a low pass filter that receives the output from the operational amplifier to output the detection signal and a smoothing circuit that receives the output from the operational amplifier to output the offset signal.

According to the embodiment of the present invention, since the determination circuit in the output circuit of the charge mode sensor discriminatively outputs the detection signal of the charge mode sensor and the offset signal indicating the break or short circuit of the charge mode sensor or the sensor cable, it is possible to rapidly and sequentially determine whether any fault occurs in the charge mode sensor or the sensor cable both before the detection signal of the charge mode sensor is acquired and while the detection signal of the charge mode sensor is being acquired.

It is preferred that the second resistor be a resistance thermometer and detect an temperature near the charge mode sensor from the offset signal.

According to the embodiment of the present invention, it is possible to measure the temperature of the charge mode sensor to use the measured temperature in the temperature compensation of the measurement data in the output circuit of the charge mode sensor.

The determination circuit preferably includes a differential amplifier to which the inverting input and the output of the operational amplifier are supplied. The low pass filter and the smoothing circuit are preferably connected to an output of the differential amplifier.

Obviously, numerous modifications and variations of the present invention are possible in light of the above teachings. It is therefore to be understood that within the scope of the appended claims, the invention may be practiced otherwise than as specifically described herein.

What is claimed is:

1. An output circuit of the charge mode sensor, comprising:
   a second resistor connecting an output portion of the charge mode sensor and a ground; and
   an operational amplifier configured to output a detection signal that varies in accordance with an amount of charge kept in the charge mode sensor and comprising:
      an inverting input portion connected to the output portion of the charge mode sensor via a sensor cable;

a non-inverting input portion connected to a reference voltage; and an output portion of the operational amplifier connected to the inverting input portion via a first resistor, wherein the operational amplifier is configured to output a certain offset signal if a break or short circuit occurs in the charge mode sensor or the sensor cable.

2. The output circuit of the charge mode sensor according to claim 1, wherein the reference voltage is a certain voltage higher than zero volt, and wherein an offset signal from the operational amplifier is the certain voltage or a saturated output voltage from the operational amplifier depending on the break or short circuit of the charge mode sensor or the sensor cable.

3. The output circuit of the charge mode sensor according to claim 1, further comprising:

a determination circuit connected to the output portion of the operational amplifier and configured to determine any break or short circuit of the charge mode sensor or the sensor cable, wherein the determination circuit comprises a low pass filter configured to receive an output from the operational amplifier to output the detection signal and a smoothing circuit configured to receive the output from the operational amplifier to output the offset signal.

4. The output circuit of the charge mode sensor according to claim 1, wherein the second resistor comprises a resistance thermometer and is configured to detect a temperature in a vicinity of the charge mode sensor from the offset signal.

5. The output circuit of the charge mode sensor according to claim 3, wherein the determination circuit includes a differential amplifier to which an inverting input and the output of the operational amplifier are supplied, and wherein the low pass filter and the smoothing circuit are connected to an output of the differential amplifier.

6. The output circuit of the charge mode sensor according to claim 2, further comprising:

a determination circuit connected to the output of the operational amplifier and configured to determine any break or short circuit of the charge mode sensor or the sensor cable, wherein the determination circuit comprises a low pass filter configured to receive an output from the operational amplifier to output the detection signal and a smoothing circuit configured to receive the output from the operational amplifier to output the offset signal.

7. The output circuit of the charge mode sensor according to claim 2, wherein the second resistor comprises a resistance thermometer and is configured to detect an temperature in a vicinity of the charge mode sensor from the offset signal.

8. The output circuit of the charge mode sensor according to claim 3, wherein the second resistor comprises a resistance thermometer and is configured to detect an temperature in a vicinity of the charge mode sensor from the offset signal.

9. The output circuit of the charge mode sensor according to claim 6, wherein the second resistor comprises a resistance thermometer and is configured to detect an temperature in a vicinity of the charge mode sensor from the offset signal.

10. The output circuit of the charge mode sensor according to claim 4, wherein the determination circuit includes a differential amplifier to which an inverting input and an output of the operational amplifier are supplied, and wherein a low pass filter and a smoothing circuit are connected to an output of the differential amplifier.

11. The output circuit of the charge mode sensor according to claim 6, wherein the determination circuit includes a differential amplifier to which an inverting input and the output of the operational amplifier are supplied, and wherein the low pass filter and the smoothing circuit are connected to an output of the differential amplifier.

12. The output circuit of the charge mode sensor according to claim 7, wherein the determination circuit includes a differential amplifier to which an inverting input and an output of the operational amplifier are supplied, and wherein the low pass filter and the smoothing circuit are connected to an output of the differential amplifier.

13. The output circuit of the charge mode sensor according to claim 8, wherein the determination circuit includes a differential amplifier to which an inverting input and the output of the operational amplifier are supplied, and wherein the low pass filter and the smoothing circuit are connected to an output of the differential amplifier.

14. The output circuit of the charge mode sensor according to claim 9, wherein the determination circuit includes a differential amplifier to which an inverting input and the output of the operational amplifier are supplied, and wherein the low pass filter and the smoothing circuit are connected to an output of the differential amplifier.

* * * * *